(12) United States Patent
Stoltzfus et al.

(10) Patent No.: US 9,514,864 B2
(45) Date of Patent: Dec. 6, 2016

(54) SOLID-STATE RESISTOR FOR PULSED POWER MACHINES

(71) Applicant: Sandia Corporation, Albuquerque, NM (US)

(72) Inventors: Brian Stoltzfus, Albuquerque, NM (US); Mark E. Savage, Albuquerque, NM (US); Brian Thomas Hutsel, Sandia Park, NM (US); William E. Fowler, Stanardsville, VA (US); Keven Alan MacRunnels, Albuquerque, NM (US); David Justus, Tijeras, NM (US); William A. Stygar, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/619,536

(22) Filed: Feb. 11, 2015

(65) Prior Publication Data
US 2015/0243413 A1 Aug. 27, 2015

Related U.S. Application Data

(60) Provisional application No. 61/943,567, filed on Feb. 24, 2014.

(51) Int. Cl.
| | |
|---|---|
| *H01C 1/02* | (2006.01) |
| *H01C 1/028* | (2006.01) |
| *H01C 1/16* | (2006.01) |
| *H01C 13/02* | (2006.01) |
| *H01C 1/082* | (2006.01) |
| *H03K 3/53* | (2006.01) |

(52) U.S. Cl.
CPC ........... *H01C 1/028* (2013.01); *H01C 1/16* (2013.01); *H01C 13/02* (2013.01); *H01C 1/082* (2013.01); *H03K 3/53* (2013.01)

(58) Field of Classification Search
CPC .................................. H01C 1/024; H01C 7/00
USPC ............................................. 338/231, 55, 53
See application file for complete search history.

(56) References Cited

U.S. PATENT DOCUMENTS

| | | | | |
|---|---|---|---|---|
| 4,072,848 | A * | 2/1978 | Johnson | H05B 3/56 174/520 |
| 4,114,134 | A * | 9/1978 | Kley | H01C 1/028 338/114 |
| 5,231,371 | A * | 7/1993 | Kobayashi | H02H 9/026 338/21 |

(Continued)

OTHER PUBLICATIONS

Beverly III, R.E. et al., "Aqueous-electrolyte resistors for pulsed power applications", Review of Scientific Instruments, 1995, pp. 5625-5629, vol. 66.

(Continued)

*Primary Examiner* — Kyung Lee
(74) *Attorney, Agent, or Firm* — Kevin W. Bieg

(57) ABSTRACT

A flexible solid-state resistor comprises a string of ceramic resistors that can be used to charge the capacitors of a linear transformer driver (LTD) used in a pulsed power machine. The solid-state resistor is able to absorb the energy of a switch prefire, thereby limiting LTD cavity damage, yet has a sufficiently low RC charge time to allow the capacitor to be recharged without disrupting the operation of the pulsed power machine.

6 Claims, 4 Drawing Sheets

(56) References Cited

U.S. PATENT DOCUMENTS

| | | | | |
|---|---|---|---|---|
| 5,508,677 | A * | 4/1996 | Neubert | H01C 3/02 |
| | | | | 338/53 |
| 5,997,940 | A * | 12/1999 | Delvinquier | H01C 1/028 |
| | | | | 29/25.03 |
| 7,679,297 | B1 * | 3/2010 | Stygar | G21B 1/21 |
| | | | | 315/5.41 |
| 7,876,194 | B2 * | 1/2011 | Ihle | H01C 1/16 |
| | | | | 219/211 |
| 7,936,247 | B2 * | 5/2011 | Ihle | H01C 1/014 |
| | | | | 338/210 |

OTHER PUBLICATIONS

Gerasimov, A.I., "Aqueous-Solution High-Voltage Resistors: Development, Study, and Application (Review)", Instruments and Experimental Techniques, 2006, pp. 1-26, vol. 49, No. 1.

Whiteley, R.V. et al., "Electrochemical Characterization of Liquid Resistors", IEEE Power Electronics Specialist Conference, Albuquerque, (1983), pp. 654-657.

Stygar, W.A. et al., "Architecture of petawatt-class z-pinch accelerators", Physical Review Special Topics—Accelerators and Beams, 2007, pp. 030401-1-030401-24, vol. 10.

Mazarakis, Michael G. et al., "High current, 0.5-MA, fast, 100-ns, linear transformer driver experiments", Physical Review Special Topics—Accelerators and Beams, 2009, 050401-1-050401-10, vol. 12.

Gruner, et al., "High-Voltage, Low-Inductance Gas Switch", U.S. Appl. No. 14/099,524, filed Dec. 6, 2013.

\* cited by examiner

SOLID-STATE RESISTOR FOR PULSED POWER MACHINES

CROSS-REFERENCE TO RELATED APPLICATION

This application claims the benefit of U.S. Provisional Application No. 61/943,567, filed Feb. 24, 2014, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to resistors for pulsed power systems and, in particular, to a solid-state resistor for pulsed power machines.

BACKGROUND OF THE INVENTION

Most pulsed power machines require the use of resistors that are subject to high voltage and high power dissipation. Aqueous-electrolyte resistors have traditionally been used in pulsed power systems for fast voltage-divider probes, charging/trigger resistors in Marx banks, dummy loads, absorbers of reflected pulses, and capacitor bank dumps. These water-based resistors are simple, robust, have low-inductance, are capable of operation at high voltage and high current, and are capable of dissipating large pulse energies while preserving their operating capacity. Further, the resistivity can be easily changed simply by adjusting the electrolyte concentration. See R. E. Beverly and R. N. Campbell, *Rev. Sci. Instrum.* 66, 5825 (1995); and A. I. Gerasimov, *Instrum. Exper. Tech.* 49, 5 (2006). However, water-based resistors have some problems. If the water resistor leaks, the water will degrade the dielectric strength of the surrounding oil, which is often used as an insulator in pulsed power machines. Also, the charge flow through the resistor is limited by the resistivity of the water solution. As the resistivity of the solution increases, the total charge through the resistor must be reduced to avoid electrolysis which can generate gas in the resistor. See R. V. Whitely and J. M. Wilson, *IEEE Power Electron. Specialists Conf.*, 654 (1983). For these reasons, solid-state resistors have been pursued for many years as a possible replacement. However, most solid-state resistor designs have a number of other problems, such as inflexibility, low power tolerance, and low voltage hold off.

Therefore, a need remains for a solid-state resistor that can be used in pulsed power machines.

SUMMARY OF THE INVENTION

The present invention is directed to a solid-state resistor for pulsed power machines comprising a flexible string of at least two ceramic resistors; an insulating outer shell enclosing the string of ceramic resistors; and insulating oil contained within the outer shell and encapsulating the string of ceramic resistors. The solid-state resistor has a resistance greater than 50 kohm.

BRIEF DESCRIPTION OF THE DRAWINGS

The detailed description will refer to the following drawings, wherein like elements are referred to by like numbers.

DETAILED DESCRIPTION OF THE INVENTION

Linear transformer drivers (LTDs) are being considered for many pulsed power applications. In particular, LTDs are being developed for use as the prime-power source for next-generation petawatt-class pulsed power accelerators, replacing convention Marx generators. For example, thousands of LTD cavities can be used in a series-parallel combination to achieve peak powers substantially in excess of that of the present 80-terawatt Z machine. See W. A. Stygar et al., *Phys. Rev. Special Topics—Accelerators and Beams* 10, 030401 (2007); and U.S. Pat. No. 7,679,297 to Stygar et al., which are incorporated herein by reference.

Figure 1:
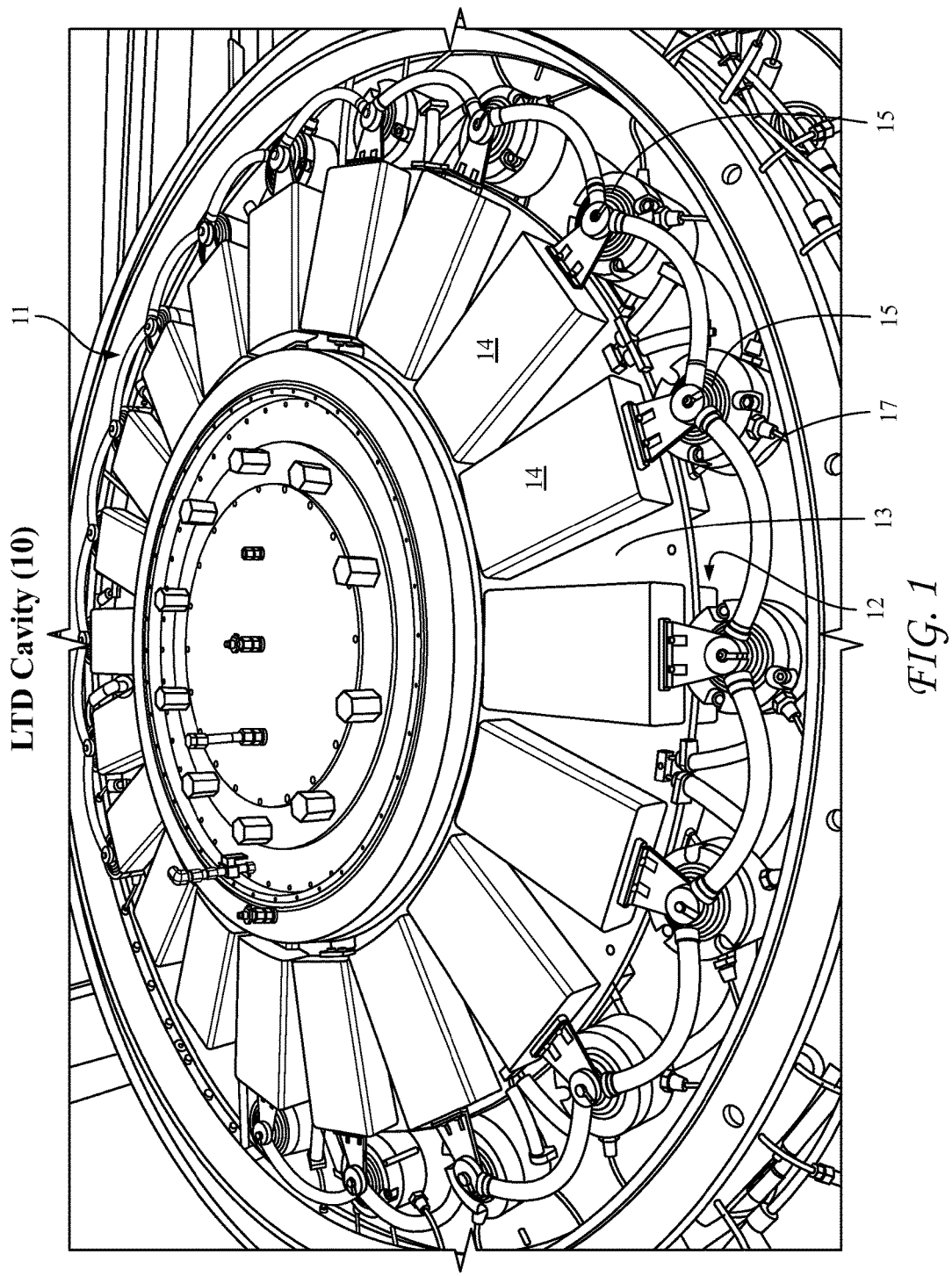
FIG. 1 is a top-view photograph of a linear transformer driver (LTD) cavity.
Figure 2:
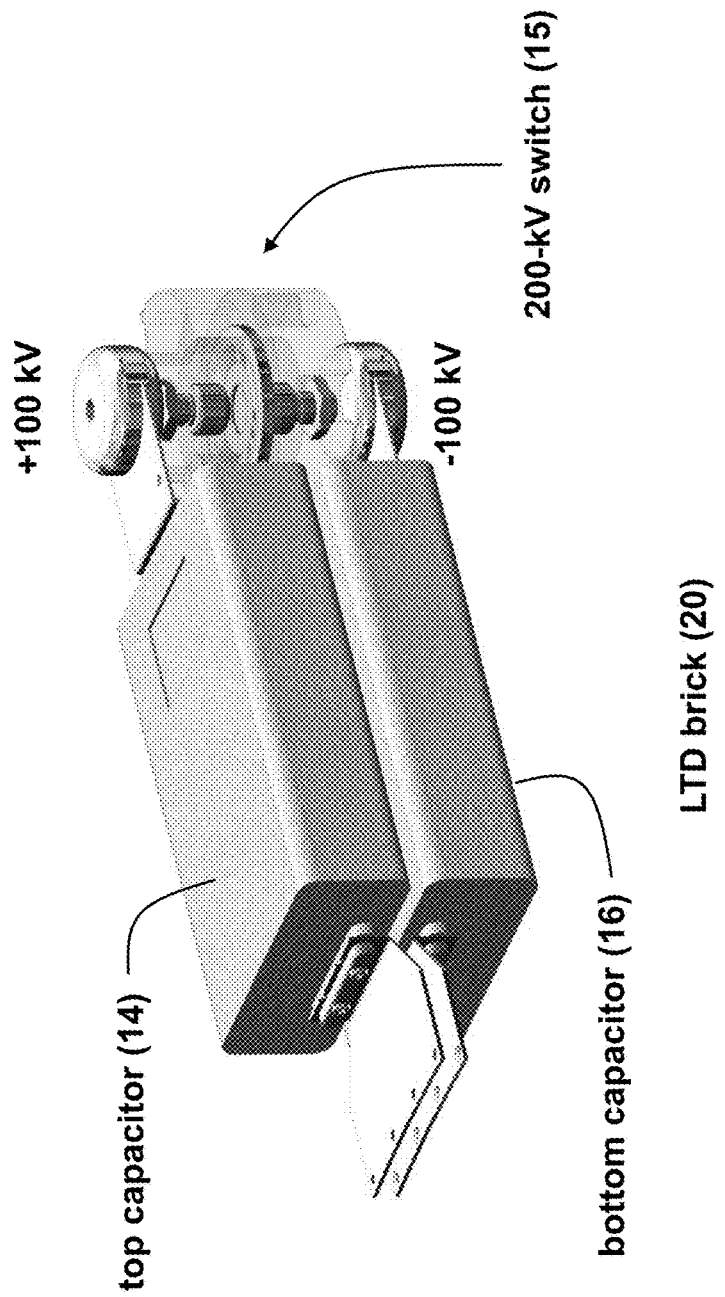
FIG. 2 is a perspective side-view illustration of a brick.

An LTD cavity is basically an induction accelerator cavity that encloses an entire pulse-forming network that generates an output pulse. The pulse is applied across an insulator that separates the anode and cathode output electrodes (A-K gap) of the cavity. See M. G. Mazarakis et al., *Phys. Rev. Special Topics—Accelerators and Beams* 12, 050401 (2009), which is incorporated herein by reference. FIG. 1 shows a top-view photograph of an LTD cavity 10 wherein the energy storage section comprises two circular arrays of single-ended capacitors. Only the top array 11 is clearly visible in this photograph. The top array 11 is separated from the bottom array 12 by a plastic insulator plate 13. Each of the top capacitors 14 can be charged to +100 kV maximum charge and the bottom capacitors can be charged to −100 kV. Each pair of negatively and positively charged capacitors are connected in series with a separate switch 15 positioned vertically between them and capable of holding the 200 kV potential difference. For example, the switch 15 can be a high-voltage, low-inductance gas switch. See U.S. application Ser. No. 14/099,524, filed Dec. 6, 2013, which is incorporated herein by reference. The energy storage section of the LTD can be insulated in cavity oil (not shown). FIG. 2 is a perspective side-view illustration of the basic unit, known as a "brick" 20, comprising two oppositely charged capacitors 14 and 16 and one switch 15 connected in series, which defines the period of the cavity output pulse. The LTD cavity 10 shown in FIG. 1 consists of 20 bricks, and is capable of providing a peak power of 79 GW, peak voltage of 108 kV, and peak current of 750 kA.

Figure 3:
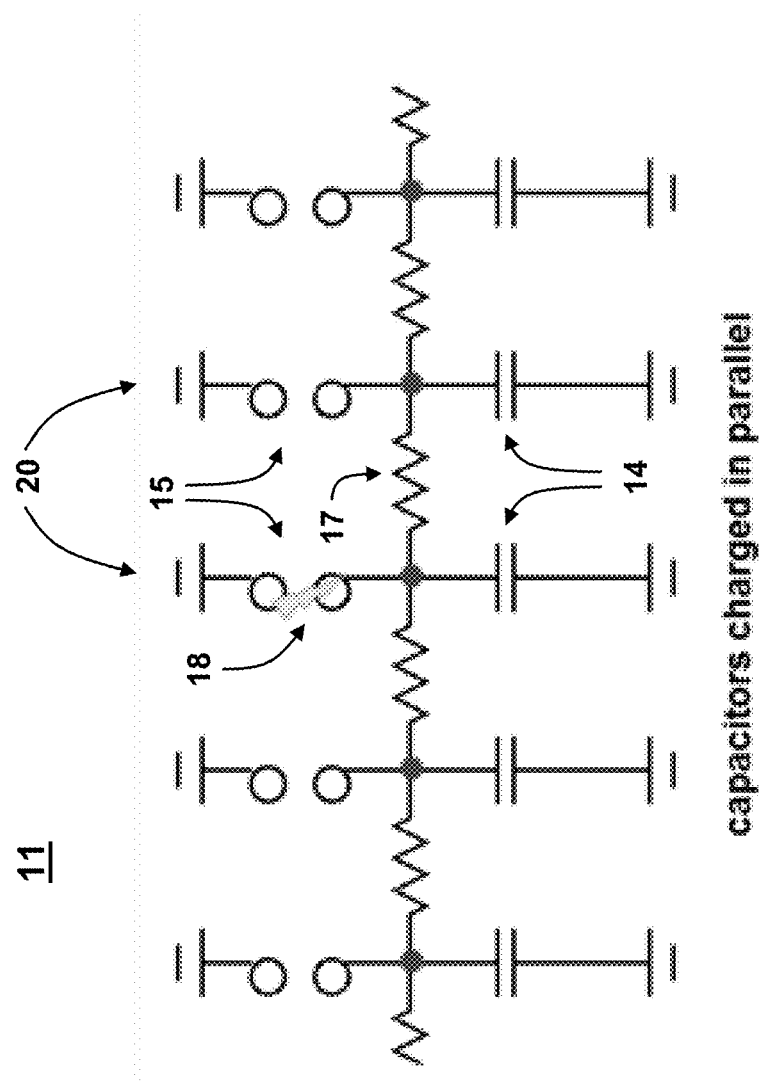
FIG. 3 is a schematic illustration of capacitors charged in parallel, showing how a capacitor bank can discharge through a single prefired switch.

As shown in FIG. 3, the capacitors 14 of the array 11 are charged in parallel. The bricks 20 are all DC linked and pulse isolated during charging by charge resistors 17 between the capacitor terminals (also shown in FIG. 1). Aqueous-electrolyte resistors can typically have values ranging around 1 kohm, but higher values are required to quench prefires 18 of a switch 15 without dumping the entire LTD cavity. Although a charge resistance of 1 kohm is sufficient to isolate the adjacent capacitors on a nanosecond time scale (as is required for a normal shot), it is too low to effectively isolate the other capacitors on a longer timescale (as is required in the case of a switch prefire). In particular, if the isolating charge resistance is low, then a switch prefire will cause all the connected capacitors to discharge through the switch arc. While a higher resistance can limit cavity damage and reduce the effects of switch prefire, the resistance is preferably still low enough to maintain a reasonable RC charge time for a given application. It was found that by simply increasing the isolating charge resistance to >50 kohms, the switch arc can be quenched after discharging it's brick. The capacitors limit the rate of voltage increase across the arc, which also helps the quench. The current supplied by the rest of the capacitor bank is too low (e.g., <2 A) to sustain the switch arc at the lower voltage and it is extinguished on the microsecond time scale. The brick can then be recharged in less than a second, based on the RC time constant of the capacitor and charge resistor, and the shot continues as normal (e.g., the RC time constant for 50 kohms and 40 nF is 2 ms).

However, it is very hard to make water-based resistors greater than a few kohms. High resistivity water resistors are difficult because they don't tolerate the DC charge current well. This is because resistance values higher than a few kohms require a high water resistivity, which limits the amount of current which can be passed through the resistors without causing electrochemical gas formation inside the resistor. In addition, water-based resistors are a possible source of cavity oil contamination. However, solid-state resistors can be difficult to implement in pulsed power machines. For one, in general, their energy handling capacity is less than that of water (e.g., the resistor must be able to handle half of the capacitor energy during rapid recharge (about 100 J) and the full charge voltage of about 100 kV). They are usually stiff and brittle and they do not stand up well to shocks from nearby oil arcs. Often they will absorb oil. If the solid-state resistor is heated, the difference in the coefficients of thermal expansion in the resistor can lead to mechanical failure. If debris accumulates on the resistor surface, it can track easily. Lastly, in a high field environment, small E-field enhancements will often start tracking damage which accumulates over many shots (e.g., the resistor must fit in a small space and tolerate high static E-field strengths on the order of 50 kV/cm).

According to the present invention, the solid-state resistor can comprise ceramic resistors strung together which conduct through the whole body of the resistor to maximize its energy capacity. Preferably, the ceramic resistors have a sufficiently high impulse energy rating (e.g., ~70 J per resistor) so that the total impulse energy rating of the string is greater than the energy stored in the connected capacitor, and a sufficiently high impulse voltage hold off (e.g., ~7,500 V in air). Preferably, the ceramic resistor has a coating (e.g., epoxy) that limits the resistor's exposure to oil. Finally, the total series resistance of the string of resistors is preferably greater than 50 kohms.

Figure 4:
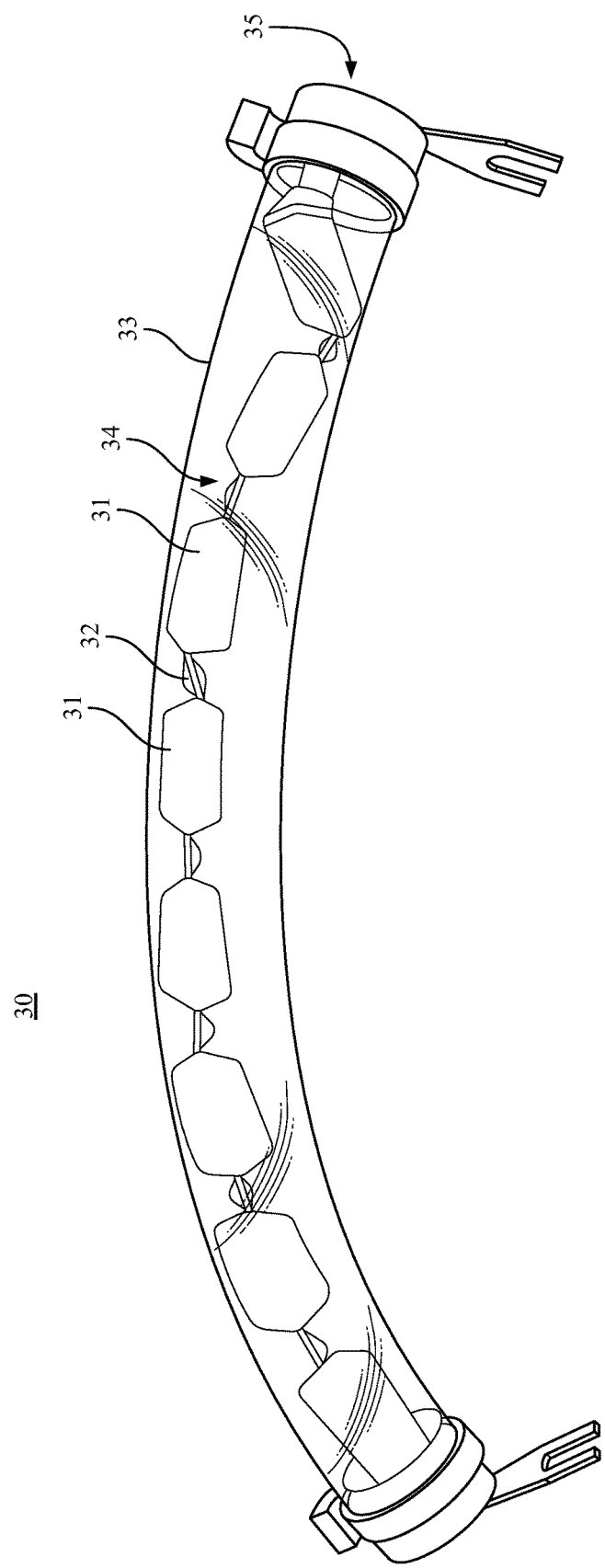
FIG. 4 is a photograph of a solid-state charge resistor.

An exemplary solid-state resistor 30 comprising a string of ceramic resistors 31 is shown in FIG. 4. As an example, commercial-of-the-shelf 2W ceramic resistors (e.g., RT818A series resistors manufactured by HVR Advanced Power Components, http://www.hvrapc.com) were soldered together to make a series string of ~8× resistors. The number of ceramic resistors and the resistance value of the resistors can be adjusted to suit the application. The ceramic resistors 31 can be soldered 32 closely together and in a manner to reduce E-field enhancements from the leads. By soldering the string together, the string remains flexible, and thus able to endure mechanical shock from arcing in the surrounding insulating oil. The resistor 30 can have an insulating outer shell which the oil doesn't penetrate and protects the inner ceramic. For example, the ceramic resistors 31 can be enclosed in a flexible polymer (e.g., Tygon®)) tube 33, which is flexible, keeps debris off the resistor surface, adds another layer of electrical breakdown protection, and maintains the high quality oil 34 inside the resistor 30. The oil 34 inside the tube 33 further insulates the high voltage/high E-field around the ceramic resistors and prevents the resistors from arcing to adjacent components. The oil 34 can be moisture free, degassed, and particle free transformer oil. For example, the assembly can be placed in a vacuum chamber and left to sit at a pressure <1 torr to remove gas and moisture from the oil and ceramic resistor string. The resistor 30 can then be plugged with a connector 35 at each end in whatever manner suits the application. In experiments, these solid-stare resistors have effectively quenched hundreds of switch prefires and have survived in an LTD cavity for about 1,000 machine shots (144,000 resistor shots). Further, the solid-state resistor was able to absorb 560 J impulse and 14 mA charge current.

The present invention has been described as a solid-state resistor for pulsed power machines. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A solid-state resistor for pulsed power machines, comprising:
   a flexible string of at least two ceramic resistors, wherein the at least two ceramic resistors are connected in series;
   an insulating outer shell enclosing the string of ceramic resistors; and
   insulating oil contained within the outer shell and encapsulating the string of ceramic resistors.

2. The solid-state resistor of claim 1, wherein the resistance of the resistor is greater than 50 kohm.

3. The solid-state resistor of claim 1, wherein the insulating outer shell comprises a flexible polymer tube.

4. The solid-state resistor of claim 1, wherein each ceramic resistor has an impulse energy rating of greater than 70 joules.

5. The solid-state resistor of claim 1, wherein each ceramic resistor has an impulse voltage hold off of greater than 7,500 V in air.

6. The solid-state resistor of claim 1, wherein the pulsed power machine comprises a linear transformer driver cavity comprising two or more bricks, each brick comprising two oppositely charged capacitors and one switch connected in series, wherein pairs of the two of more bricks are DC linked and pulse isolated during charging by a solid-state resistor between the capacitor terminals of each pair of bricks.

* * * * *